United States Patent
Seo et al.

(10) Patent No.: US 11,171,299 B2
(45) Date of Patent: Nov. 9, 2021

(54) QUANTUM DOT DEVICE AND ELECTRONIC DEVICE

(71) Applicant: SAMSUNG ELECTRONICS CO., LTD., Suwon-si (KR)

(72) Inventors: Hongkyu Seo, Anyang-si (KR); Eun Joo Jang, Suwon-si (KR); Moon Gyu Han, Suwon-si (KR); Tae Ho Kim, Seongnam-si (KR); Dae Young Chung, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 350 days.

(21) Appl. No.: 16/296,505

(22) Filed: Mar. 8, 2019

(65) Prior Publication Data

US 2019/0280230 A1    Sep. 12, 2019

(30) Foreign Application Priority Data

Mar. 9, 2018  (KR) .................. 10-2018-0028285
Mar. 6, 2019  (KR) .................. 10-2019-0025980

(51) Int. Cl.
*H01L 51/50* (2006.01)
*C09K 11/88* (2006.01)
(Continued)

(52) U.S. Cl.
CPC .......... *H01L 51/502* (2013.01); *C09K 11/883* (2013.01); *H01L 51/5004* (2013.01);
(Continued)

(58) Field of Classification Search
None
See application file for complete search history.

(56) References Cited

U.S. PATENT DOCUMENTS 8,911,881 B2    12/2014  Lee et al.
2007/0024188 A1   2/2007  Kim et al.
(Continued)

FOREIGN PATENT DOCUMENTS

CN    105244451 A      1/2016
KR    20060040829 A    5/2006
(Continued)

OTHER PUBLICATIONS

Extended European Search Report dated Jul. 19, 2019, of the corresponding European Patent Application No. 19161675.4.
(Continued)

*Primary Examiner* — Gregory D Clark
(74) *Attorney, Agent, or Firm* — Cantor Colburn LLP (57) ABSTRACT

A quantum dot device including an anode; a cathode disposed substantially opposite to the anode; a hole injection layer disposed on the anode between the anode and the cathode; a hole transport layer disposed on the hole injection layer between the hole injection layer and the cathode; and a quantum dot layer disposed on the hole transport layer between the hole transport layer and the cathode, wherein the quantum dot layer includes a plurality of quantum dots, wherein the hole transport layer includes a hole transport material and an electron transport material, and wherein a lowest unoccupied molecular orbital (LUMO) energy level of the electron transport material and a lowest unoccupied molecular orbital (LUMO) energy level of the quantum dot layer is about 0.5 electron volts or less.

20 Claims, 2 Drawing Sheets

(51) Int. Cl.
  *H01L 51/56* (2006.01)
  *B82Y 20/00* (2011.01)
(52) U.S. Cl.
  CPC ...... *H01L 51/5056* (2013.01); *H01L 51/5072* (2013.01); *H01L 51/5084* (2013.01); *H01L 51/5092* (2013.01); *H01L 51/5096* (2013.01); *H01L 51/56* (2013.01); *B82Y 20/00* (2013.01); *H01L 2251/552* (2013.01)

(56) References Cited

U.S. PATENT DOCUMENTS

| | | |
|---|---|---|
| 2007/0132370 A1 | 6/2007 | Boerner et al. |
| 2007/0172700 A1 | 7/2007 | Nishita |
| 2012/0211735 A1 | 8/2012 | Imada et al. |
| 2014/0302627 A1* | 10/2014 | Ko ............ C09K 11/025 438/35 |
| 2017/0069864 A1 | 3/2017 | Lee et al. |
| 2017/0162816 A1 | 6/2017 | Kim et al. |

FOREIGN PATENT DOCUMENTS

| | | |
|---|---|---|
| KR | 0695307 B1 | 3/2007 |
| KR | 20120016342 A | 2/2012 |
| KR | 20120050146 A | 5/2012 |
| KR | 1304409 B1 | 9/2013 |
| KR | 1546622 B1 | 8/2015 |
| KR | 1686104 B1 | 12/2016 |
| KR | 20170029708 A | 3/2017 |
| KR | 20170066898 A | 6/2017 |

OTHER PUBLICATIONS

Xiaoli Zhang et al., "All-solution processed composite hole transport layer for Quantum dot light emitting diode," Thin Solid Films, Mar. 31, 2016, pp. 187-192, vol. 603.

* cited by examiner

QUANTUM DOT DEVICE AND ELECTRONIC DEVICE

CROSS-REFERENCE TO RELATED APPLICATION

This application claims priority to and the benefit of Korean Patent Application No. 10-2018-0028285 filed in the Korean Intellectual Property Office on Mar. 9, 2018, and Korean Patent Application No. 10-2019-0025980 filed in the Korean Intellectual Property Office on Mar. 6, 2019, and all the benefits accruing therefrom under 35 U.S.C. § 119, the entire contents of which are incorporated herein by reference.

BACKGROUND

1. Field

A quantum dot device and an electronic device are disclosed.

2. Description of the Related Art

Physical characteristics (e.g., energy bandgaps, melting points, etc.) of nanoparticles t are intrinsic characteristics that may be controlled by changing the particle size, unlike for bulk materials. For example, semiconductor nanocrystals, also known as quantum dots, may be supplied with photoenergy or electrical energy and emit light in a wavelength corresponding to the particle size(s) of the quantum dots. Accordingly, the quantum dots may be used as a light emitting element to emit light of a particular wavelength.

There is a continuing interest in developing quantum dot devices using quantum dots as light emitting elements. Because quantum dots are fundamentally different from conventional light emitting elements, the challenges associated with developing quantum dot devices can require more than the technology of conventional light devices.

SUMMARY

An embodiment provides a quantum dot device capable of realizing improved performance.

Another embodiment provides an electronic device including the quantum dot device.

According to an embodiment, a quantum dot device includes an anode; a cathode disposed substantially opposite to the anode; a hole injection layer disposed on the anode between the anode and the cathode; a hole transport layer disposed on the hole injection layer between the hole injection layer and the cathode; a quantum dot layer disposed on the hole transport layer between the hole transport layer and the cathode, wherein the quantum dot layer includes a plurality of quantum dots, wherein the hole transport layer includes a hole transport material and an electron transport material, and wherein a difference between a lowest unoccupied molecular orbital (LUMO) of the electron transport material and a lowest unoccupied molecular orbital (LUMO) energy level of the quantum dot layer is about 0.5 electron volts (eV) or less.

The lowest unoccupied molecular orbital (LUMO) energy level of the electron transport material may be about 2.7 eV to about 3.5 eV.

The highest occupied molecular orbital (HOMO) energy level of the hole transport material may be about 5.4 eV or greater.

The highest occupied molecular orbital (HOMO) energy level of the hole transport material may be about 5.4 eV to about 7.0 eV.

The hole transport material may include a polymer compound, and the electron transport material may include a low molecular weight compound.

The hole transport material may include a first hole transport material and a second hole transport material, wherein a highest occupied molecular orbital (HOMO) energy level of the second hole transport material may be greater than a highest occupied molecular orbital (HOMO) energy level of the first hole transport material.

The highest occupied molecular orbital (HOMO) energy level of the second hole transport material may be about 5.4 eV to about 7.0 eV.

The hole transport material and the electron transport material may be intermixed in the hole transport layer.

The hole transport layer may include the electron transport material in an amount that is equal to or less than an amount of the hole transporting material.

The difference between a highest occupied molecular orbital (HOMO) energy level of the quantum dot layer and a highest occupied molecular orbital (HOMO) energy level of the hole transport material may be about 0.7 eV or less.

The highest occupied molecular orbital (HOMO) energy level of the quantum dot may be about 5.6 eV or greater.

The hole transport layer and the quantum dot layer may be in direct contact with each other.

The hole injection layer may include a conductive polymer.

The plurality of quantum dots may include a non-cadmium-containing quantum dot. For example, the plurality of quantum dots may be cadmium-free or include no cadmium quantum dots.

The plurality of quantum dots may include a core including a first semiconductor compound including zinc (Zn), tellurium (Te), and selenium (Se); and a shell disposed on at least a portion of the core and including a second semiconductor compound different from the first semiconductor compound.

The second semiconductor compound may be ZnSeS, ZnS, or a combination thereof.

According to another embodiment, an electronic device includes the quantum dot device.

According to another embodiment, a method of producing the quantum dot device includes providing the anode; disposing the hole injection layer on the anode; disposing the hole transport layer on the hole injection layer on a side opposite the anode; disposing the quantum dot layer on the hole transport layer on a side opposite the hole injection layer; and disposing the cathode on the quantum dot layer on a side opposite the hole transport layer.

The method can further include disposing an electron auxiliary layer between the quantum dot layer and the cathode layer.

The electron auxiliary layer may be an electron transport layer, an electron injection layer, a hole blocking layer, or a combination thereof.

Performance of the quantum dot device may be improved.

BRIEF DESCRIPTION OF THE DRAWINGS

These and/or other aspects will become apparent and more readily appreciated from the following description of the embodiments, taken in conjunction with the accompanying drawing, in which.

DETAILED DESCRIPTION

Hereinafter, example embodiments of the present disclosure will be described in detail so that a person skilled in the art would understand the same. This disclosure may, however, be embodied in many different forms and is not construed as limited to the example embodiments set forth herein. If not defined otherwise, all terms (including technical and scientific terms) in the specification may be defined as commonly understood by one skilled in the art. The terms defined in a generally-used dictionary may not be interpreted ideally or exaggeratedly unless clearly defined. In addition, unless explicitly described to the contrary, the word "comprise" and variations such as "comprises" or "comprising", will be understood to imply the inclusion of stated elements but not the exclusion of any other elements. The term "a combination thereof" is open ended and means including at least one of the listed components, and may include other like components.

The terminology used herein is for the purpose of describing particular embodiments only and is not intended to be limiting. As used herein, the singular forms "a," "an" and "the" are intended to include the plural forms as well, unless the context clearly indicates otherwise. As used herein, the term "and/or" includes any and all combinations of one or more of the associated listed items. The term "or" means "and/or." Expressions such as "at least one of" when preceding a list of elements, modify the entire list of elements and do not modify the individual elements of the list.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. Accordingly, the embodiments are merely described below, by referring to the figures, to explain aspects of the present description.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, a first element, component, region, layer, or section discussed below could be termed a second element, component, region, layer, or section without departing from the teachings of the present embodiments.

Relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "Group" in the term Group III, Group II, and the like refers to a group of the Periodic Table. Hereinafter, a work function (WF), a highest occupied molecular orbital (HOMO) energy level, and a lowest unoccupied molecular orbital (LUMO) energy level are expressed as an absolute value from a vacuum energy level (i.e., 0 electron volts (eV)). In addition, when the work function, the HOMO energy level, or the LUMO energy level is referred to be "deep," "high" or "large," the work function, the HOMO energy level, or the LUMO energy level has a larger absolute value based on "0 eV" of the vacuum energy level, while when the work function, the HOMO energy level, or the LUMO energy level is referred to be "shallow," "low," or "small," the work function, the HOMO energy level, or the LUMO energy level has a smaller absolute value based on "0 eV" of the vacuum energy level.

Hereinafter, a quantum dot device according to an embodiment is described with reference to drawings.

Figure 1:
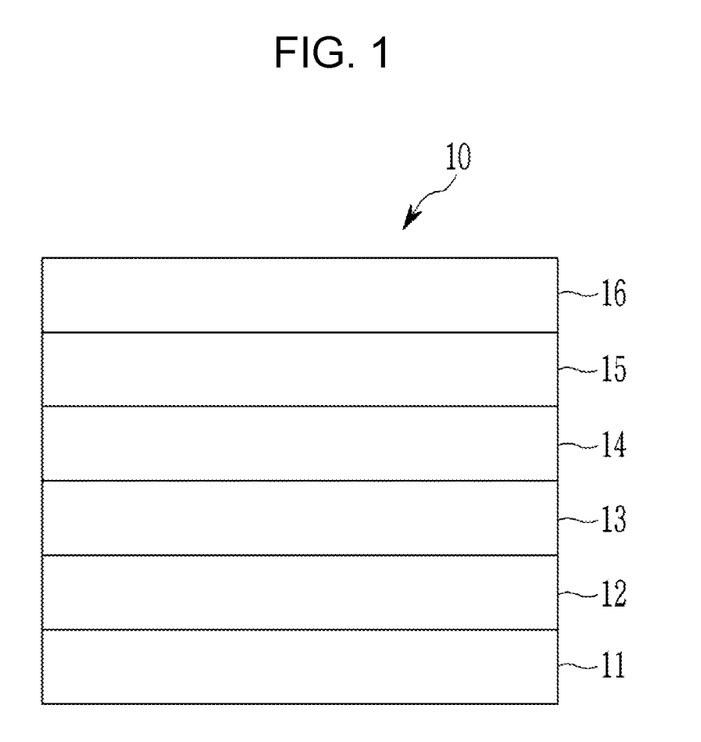
FIG. 1 is a schematic cross-sectional view of a quantum dot device according to an embodiment.
Figure 2:
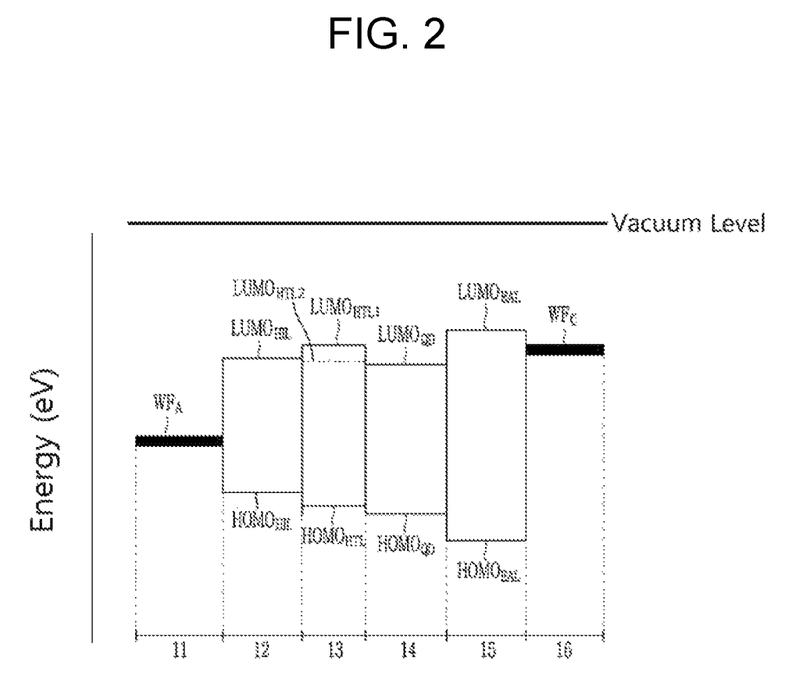
FIG. 2 is an energy level diagram showing an example of an energy level of the quantum dot device of FIG. 1.

FIG. 1 is a schematic cross-sectional view of a quantum dot device according to an embodiment and FIG. 2 is a diagram showing an example of an energy level diagram of the quantum dot device of FIG. 1.

Referring to FIG. 1 a quantum dot device 10 according to an embodiment includes an anode 11 and a cathode 16 oppositely facing each other, a quantum dot layer 14 disposed between the anode 11 and the cathode 16, a hole injection layer 12 and a hole transport layer 13 disposed between the anode 11 and the quantum dot layer 14, and optionally an electron auxiliary layer 15 disposed between the cathode 16 and the quantum dot layer 14. For example, the quantum dot device 10 includes an anode 11, a hole injection layer 12 disposed on the anode 11, a hole transport layer 13 disposed on the hole injection layer 12, a quantum dot layer 14 disposed on hole transport layer 13, and a cathode 16 disposed on the quantum dot layer 14.

A substrate (not shown) may be disposed at the side of the anode 11 or the cathode 16. The substrate may be for example an inorganic material such as glass; an organic material such as poly(carbonate), poly(methyl methacrylate), poly(ethylene terephthalate), poly(ethylene naphthalate), poly(amide), poly(ether sulfone), or a combination thereof; or a silicon wafer.

The anode 11 may be made of a conductor having a large work function to help hole injection, and may be, for example, a metal, a metal oxide, a conductive polymer, or a combination thereof. The anode 11 may be, for example, a metal or an alloy thereof, such as nickel, platinum, vanadium, chromium, copper, zinc, gold, or a combination thereof; a conductive metal oxide such as zinc oxide, indium oxide, tin oxide, indium tin oxide (ITO), indium zinc oxide (IZO), a fluorine-doped tin oxide, or a combination thereof; or a combination of metal and metal oxide such as ZnO and Al, or $SnO_2$ and Sb, but is not limited thereto.

The cathode 16 may be made of a conductor having a small work function to help electron injection, and may be, for example, a metal, a metal oxide, a conductive polymer, or a combination thereof. The cathode 16 may be, for example, a metal such as magnesium, calcium, sodium, potassium, titanium, indium, yttrium, lithium, gadolinium, aluminum silver, tin, lead, cesium, barium, a combination thereof, or the like, or an alloy thereof; and may be a multi-layer structure material such as LiF/Al, $LiO_2$/Al, LiF/Ca, Liq/Al, $BaF_2$/Ca, or a combination thereof, but is not limited thereto.

At least one of the anode 11 and the cathode 16 may be a light-transmitting electrode and the light-transmitting electrode may be, for example, a conductive metal oxide such as zinc oxide, indium oxide, tin oxide, indium tin oxide (ITO), indium zinc oxide (IZO), fluorine-doped tin oxide, or a combination thereof; a metal layer comprising a single layer or multiple layers (a multilayer); or a combination thereof. When one of the anode 11 and the cathode 16 is a non-light-transmitting electrode, it may be, for example, an opaque conductor such as aluminum (Al), silver (Ag), gold (Au), or a combination thereof.

The quantum dot layer 14 includes a plurality of quantum dots, hereinafter referred to quantum dots for convenience. The quantum dots may be a semiconductor nanocrystal, and may have various shapes, for example a spherical semiconductor nanocrystal, a quantum rod, or a quantum plate. Herein, the quantum rod may indicate a quantum dot having an aspect ratio of greater than about 1, for example an aspect ratio of greater than or equal to about 2, greater than or equal to about 3, or greater than or equal to about 5. For example, the quantum rod may have an aspect ratio of less than or equal to about 50, of less than or equal to about 30, or of less than or equal to about 20. In an embodiment, the quantum rod may have an aspect ratio of about 2 to about 50, or about 3 to about 30, or about 5 to about 20.

The quantum dot may have, for example, an average particle diameter (an average largest particle dimension for a non-spherical shape) of about 1 nanometer (nm) to about 100 nm, about 1 nm to about 80 nm, about 1 nm to about 50 nm, or about 1 nm to about 20 nm.

An energy bandgap of the quantum dot may be controlled according to size and a composition of the quantum dot, and thus photoluminescence or electroluminescence wavelength may be controlled. For example, as the size of quantum dot increases, the quantum dot may have a narrower energy bandgap and thus emit light in a relatively longer wavelength region, while as the size of the quantum dot decreases, the quantum dot may have a wider energy bandgap and thus emit light in a relatively shorter wavelength region.

For example, the quantum dot may emit light in a predetermined wavelength region of a visible region according to its size and/or composition. For example, the quantum dot may emit blue light, red light, or green light, and the blue light may have, for example, a peak emission wavelength in about 430 nm to about 470 nm, the red light may have, for example, a peak emission wavelength in about 620 nm to about 660 nm, and the green light may have, for example, a peak emission wavelength in about 510 nm to about 550 nm.

The quantum dot may have, for example, a quantum yield of greater than or equal to about 10%, greater than or equal to about 30%, greater than or equal to about 50%, greater than or equal to about 60%, greater than or equal to about 70%, or greater than or equal to about 90%.

The quantum dot may have a relatively narrow full width at half maximum (FWHM) in its electroluminescence spectrum. Herein, the FWHM is a width of a wavelength corresponding to a half of a peak maximum emission intensity, and as the FWHM is narrower, light in a narrower wavelength region may be emitted and higher color purity may be obtained. The quantum dot may have, for example, a FWHM of less than or equal to about 50 nm, less than or equal to about 49 nm, less than or equal to about 48 nm, less than or equal to about 47 nm, less than or equal to about 46 nm, less than or equal to about 45 nm, less than or equal to about 44 nm, less than or equal to about 43 nm, less than or equal to about 42 nm, less than or equal to about 41 nm, less than or equal to about 40 nm, less than or equal to about 39 nm, less than or equal to about 38 nm, less than or equal to about 37 nm, less than or equal to about 36 nm, less than or equal to about 35 nm, less than or equal to about 34 nm, less than or equal to about 33 nm, less than or equal to about 32 nm, less than or equal to about 31 nm, less than or equal to about 30 nm, less than or equal to about 29 nm, or less than or equal to about 28 nm in its electroluminescence spectrum.

For example, the quantum dot may be a Group II-VI semiconductor compound, a Group III-V semiconductor compound, a Group IV-VI semiconductor compound, a Group IV semiconductor compound, a Group I-III-VI semiconductor compound, a Group I-II-IV-VI semiconductor compound, a Group II-III-V semiconductor compound, or a combination thereof. The Group II-VI semiconductor compound may be for example a binary element compound such as CdSe, CdTe, ZnS, ZnSe, ZnTe, ZnO, HgS, HgSe, HgTe, MgSe, MgS, or a combination thereof; a ternary element compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or a combination thereof; and a quaternary element compound such as HgZnTeS, CdZnSeS, CdZnSeTe, CdZnSTe, CdHgSeS, CdHgSeTe, CdHgSTe, HgZnSeS, HgZnSeTe, HgZnSTe, or a combination thereof, but is not limited thereto. The Group III-V semiconductor compound may be for example a binary element compound such as GaN, GaP, GaAs, GaSb, AlN, AlP, AlAs, AlSb, InN, InP, InAs, InSb, or a combination thereof; a ternary element compound such as GaNP, GaNAs, GaNSb, GaPAs, GaPSb, AlNP, AlNAs, AlNSb, AlPAs, AlPSb, InNP, InNAs, InNSb, InPAs, InPSb, GaAlNP, or a combination thereof; and a quaternary element compound such as GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof, but is not limited thereto. The Group IV-VI semiconductor compound may be for example a binary element compound such as SnS, SnSe, SnTe, PbS, PbSe, PbTe, or a combination thereof; a ternary element compound such as SnSeS, SnSeTe, SnSTe, PbSeS, PbSeTe, PbSTe, SnPbS, SnPbSe, SnPbTe, or a combination thereof; and a quaternary element compound such as SnPbSSe, SnPbSeTe, SnPbSTe, or a combination thereof, but is not limited thereto. The Group IV semiconductor compound may be for example a single element semiconductor compound such as Si, Ge, or a combination thereof; and a binary element semiconductor compound such as SiC, SiGe, or a combination thereof, but is not limited thereto. The Group I-III-VI semiconductor compound may be CuInSe$_2$, CuInS$_2$, CuInGaSe, CuInGaS, or a combination thereof, but is not limited thereto. The Group I-III-VI semiconductor compound may be for example CuInSe$_2$, CuInS$_2$, CuInGaSe, CuInGaS, or a combination thereof, but is not limited thereto. The Group II-III-V semiconductor compound may include for example InZnP, but is not limited thereto.

The quantum dot may include the binary semiconductor compound, the ternary semiconductor compound, or the quaternary semiconductor compound in a substantially uniform concentration or partially different concentration distributions.

For example, the quantum dot may include a non-cadmium quantum dot. Cadmium (Cd) may cause environment/health problems and is a restricted element by Restriction of Hazardous Substances Directive (RoHS) in a plurality of countries, and thus the non-cadmium quantum dot may be effectively used. For example, in some embodiments the quantum dots do not include cadmium.

For example, the quantum dot may be a semiconductor compound including zinc (Zn), tellurium (Te), and selenium (Se). For example, in the semiconductor compound, an amount of tellurium (Te) may be smaller than that of selenium (Se). The semiconductor compound may emit blue light having a peak emission wavelength in a wavelength region of less than or equal to about 470 nm, for example in a wavelength region of about 430 nm to about 470 nm.

For example, the quantum dot may be a semiconductor compound including indium (In), zinc (Zn), and phosphorus (P). For example, in the semiconductor compound, a mole ratio of zinc (Zn) relative to indium (In) may be about 25 or greater. The semiconductor compound may emit blue light having a peak emission wavelength in a wavelength region of about 470 nm or less, for example in a wavelength region of about 430 nm to about 470 nm.

The quantum dot may have a core-shell structure wherein a quantum dot of a second semiconductor compound surrounds or encompasses a quantum dot of a first semiconductor compound. For example, the core and the shell of the quantum dot may have an interface, and an element of the semiconductor compound of at least one of the core or the shell at the interface may have a concentration gradient, wherein the concentration of the element(s) of the shell decreases in a direction towards the core. For example, a semiconductor composition of the shell of the quantum dot can have a higher energy bandgap than a semiconductor material of the core of the quantum dot, and thereby the quantum dot may exhibit a quantum confinement effect.

The quantum dot may have one quantum dot core and a multi-layered quantum dot shell surrounding the core, e.g., more than one shell or a shell having more than one layer. Herein, the multi-layered shell has at least two shells wherein each shell may be a single semiconductor compound, an alloy, and/or the one having a concentration gradient. For example, a shell layer of a multi-layered shell that is further away from the core may have a higher energy bandgap than a shell layer that is nearer to the core, and thereby the quantum dot may exhibit a quantum confinement effect.

For example, the quantum dot having a core-shell structure may include a core including a first semiconductor compound including zinc (Zn), tellurium (Te), and selenium (Se), and a shell disposed on at least a portion of the core and including a second semiconductor compound having a different composition from that of the core.

The Zn—Te—Se first semiconductor compound may be, for example, a Zn—Se semiconductor compound including a small molar amount of tellurium (Te) and, for example, a semiconductor compound represented by ZnTe$_x$Se$_{1-x}$ (wherein, x is greater than 0 about 0.05 or less).

For example, in the Zn—Te—Se first semiconductor compound, the mole amount of zinc (Zn) may be larger than that of selenium (Se), and the mole amount of selenium (Se) may be larger than that of tellurium (Te). For example, in the first semiconductor compound, a mole ratio of tellurium (Te) relative to selenium (Se) may be less than or equal to about 0.05, less than or equal to about 0.049, less than or equal to about 0.048, less than or equal to about 0.047, less than or equal to about 0.045, less than or equal to about 0.044, less than or equal to about 0.043, less than or equal to about 0.042, less than or equal to about 0.041, less than or equal to about 0.04, less than or equal to about 0.039, less than or equal to about 0.035, less than or equal to about 0.03, less than or equal to about 0.029, less than or equal to about 0.025, less than or equal to about 0.024, less than or equal to about 0.023, less than or equal to about 0.022, less than or equal to about 0.021, less than or equal to about 0.02, less than or equal to about 0.019, less than or equal to about 0.018, less than or equal to about 0.017, less than or equal to about 0.016, less than or equal to about 0.015, less than or equal to about 0.014, less than or equal to about 0.013, less than or equal to about 0.012, less than or equal to about 0.011, or less than or equal to about 0.01. For example, in the first semiconductor compound, a mole ratio of tellurium (Te) relative to zinc (Zn) may be less than or equal to about 0.02, less than or equal to about 0.019, less than or equal to about 0.018, less than or equal to about 0.017, less than or equal to about 0.016, less than or equal to about 0.015, less than or equal to about 0.014, less than or equal to about 0.013, less than or equal to about 0.012, less than or equal to about 0.011, or less than or equal to about 0.011.

The second semiconductor compound may include, for example, a Group II-VI semiconductor compound, a Group III-V semiconductor compound, a Group IV-VI semiconductor compound, a Group IV semiconductor compound, a Group I-III-VI semiconductor compound, a Group I-II-IV-VI semiconductor compound, a Group II-III-V semiconductor compound, or a combination thereof. Examples of the Group II-VI semiconductor compound, the Group III-V semiconductor compound, the Group IV-VI semiconductor compound, the Group IV semiconductor compound, the Group I-III-VI semiconductor compound, the Group I-II-IV-VI semiconductor compound, and the Group II-III-V semiconductor compound are the same as described above.

For example, the second semiconductor compound may include zinc (Zn), selenium (Se), sulfur (S), or a combination thereof. For example, the shell may include at least one internal shell layer disposed nearer to the core and an outermost shell layer disposed at the outermost shell region or layer of the quantum dot, and the internal shell layer may include ZnSeS and the outermost shell layer may include ZnS. For example, the shell may have a concentration gradient of one component and for example an amount of sulfur (S) may increase as the distance of the shell from the core increases.

For example, the quantum dot having a core-shell structure may include a core including a third semiconductor compound including indium (In), zinc (Zn), and phosphorus (P), and a shell disposed on at least a portion of the core and including a fourth semiconductor compound having a different composition from the core.

In the In—Zn—P-based third semiconductor compound, a mole ratio of zinc (Zn) relative to indium (In) may be greater than or equal to about 25. For example, in the In—Zn—P-based third semiconductor compound, the mole ratio of zinc (Zn) relative to indium (In) may be greater than or equal to about 28, greater than or equal to about 29, or greater than or equal to about 30. For example, in the In—Zn—P-based third semiconductor compound, the mole ratio of zinc (Zn) relative to indium (In) may be less than or equal to about 55, for example less than or equal to about 50, less than or equal to about 45, less than or equal to about 40, less than or equal to about 35, less than or equal to about 34, less than or equal to about 33, or less than or equal to about 32.

The fourth semiconductor compound may include, for example, a Group II-VI semiconductor compound, a Group III-V semiconductor compound, a Group IV-VI semiconductor compound, a Group IV semiconductor compound, a Group I-III-VI semiconductor compound, a Group I-II-IV-VI semiconductor compound, a Group II-III-V semiconductor compound, or a combination thereof. Examples of the Group II-VI semiconductor compound, the Group III-V semiconductor compound, the Group IV-VI semiconductor compound, the Group IV semiconductor compound, the Group I-III-VI semiconductor compound, the Group I-II-IV-VI semiconductor compound, and the Group II-III-V semiconductor compound are the same as described above.

For example, the fourth semiconductor compound may include zinc (Zn) and sulfur (S), and optionally selenium (Se). For example, the shell may include at least one internal shell layer disposed nearer to the core and an outermost shell layer disposed at the outermost shell layer of the quantum dot, and at least one of the internal shell layer and the outermost shell layer may include the fourth semiconductor compound of ZnS or ZnSeS.

Turning now to FIG. 1, the quantum dot layer 14 may have, for example, a thickness of about 5 nm to about 200 nm, for example about 10 nm to about 100 nm, about 10 nm to about 80 nm, about 10 nm to about 50 nm, or about 25 nm to about 40 nm.

The quantum dot layer 14 may have a relatively high HOMO energy level ($HOMO_{QD}$) and may be, for example, a HOMO energy level ($HOMO_{QD}$) of greater than or equal to about 5.4 eV, greater than or equal to about 5.5 eV, greater than or equal to about 5.6 eV, greater than or equal to about 5.7 eV, greater than or equal to about 5.8 eV, greater than or equal to about 5.9 eV, or greater than or equal to about 6.0 eV. The HOMO energy level ($HOMO_{QD}$) of the quantum dot layer 14 may be, for example, about 5.4 eV to about 7.0 eV, about 5.6 eV to about 7.0 eV, about 5.6 eV to about 6.8 eV, about 5.6 eV to about 6.7 eV, about 5.6 eV to about 6.5 eV, about 5.6 eV to about 6.3 eV, about 5.6 eV to about 6.2 eV, about 5.6 eV to about 6.1 eV, about 5.8 eV to about 7.0 eV, about 5.8 eV to about 6.8 eV, about 5.8 eV to about 6.7 eV, about 5.8 eV to about 6.5 eV, about 5.8 eV to about 6.3 eV, about 5.8 eV to about 6.2 eV, about 5.8 eV to about 6.1 eV, about 6.0 eV to about 7.0 eV, about 6.0 eV to about 6.8 eV, about 6.0 eV to about 6.7 eV, about 6.0 eV to about 6.5 eV, about 6.0 eV to about 6.3 eV, or about 6.0 eV to about 6.2 eV.

In FIG. 1, the hole injection layer 12 and the hole transport layer 13 may be disposed between the anode 11 and the quantum dot layer 14, and the hole injection layer 12 may be disposed at the side of the anode 11 and the hole transport layer 13 may be disposed at the side of the quantum dot layer 14 so that holes supplied from the anode 11 may be transported to the quantum dot layer 14 through the hole injection layer 12 and the hole transport layer 13. For example, the hole injection layer 12 may be in contact, such as direct contact, with the anode 11 and the hole transport layer 13 may be in contact, such as direct contact, with the quantum dot layer 14.

The HOMO energy level ($HOMO_{HL}$) of the hole injection layer 12 may be between a work function energy level of the anode 11 and a HOMO energy level of the quantum dot layer 14, and may be for example about 5.0 eV to about 5.5 eV.

The hole injection layer 12 may include a conductive compound, for example a conductive metal oxide, a conductive monomer, a conductive oligomer, a conductive polymer, a conductive ionic compound, or a combination thereof. For example, the conductive compound can be a conductive metal oxide, a conductive monomer, a conductive oligomer, a conductive polymer, a conductive ionic compound, or a combination thereof, having a conductivity of greater than or equal to about $1 \times 10^{-7}$ Siemens per centimeter (S/cm). For example, the conductive compound can be a conductive metal oxide, a conductive monomer, a conductive oligomer, a conductive polymer, a conductive ionic compound, or a combination thereof, having a conductivity of about $1 \times 10^{-7}$ S/cm to about 1,000 S/cm. The conductive compound may include, for example, poly(thiophene), poly(aniline), poly(pyrrole), poly(para-phenylene), poly(fluorene), poly(3,4-ethylenedioxythiophene), poly(3,4-ethylenedioxythiophene) poly(styrenesulfonate) (PEDOT:PSS), a derivative thereof, or a combination thereof, but is not limited thereto.

A HOMO energy level ($HOMO_{HTL}$) of the hole transport layer 13 may be between the HOMO energy level ($HOMO_{HL}$) of the hole injection layer 12 and the HOMO energy level ($HOMO_{QD}$) of the quantum dot layer 14. Accordingly, as show in FIG. 2, a step-like energy level may be formed from the hole injection layer 12 to the quantum dot layer 14, and the hole mobility may be effectively increased.

The HOMO energy level ($HOMO_{HTL}$) of the hole transport layer 13 may have a relatively higher HOMO energy level, similar to the HOMO energy level of the quantum dot layer 14, so as to match the HOMO energy level ($HOMO_{QD}$) of the quantum dot layer 14.

The hole transport layer 13 may include a hole transport material having a relatively higher HOMO energy level. Herein, the hole transport material may be a material having conduction characteristics along the HOMO energy level when an electric field is applied. The HOMO energy level ($HOMO_{HTL}$) of the hole transport layer 13 may be determined according to the HOMO energy level of the hole transport material, and the HOMO energy level ($HOMO_{HTL}$) of the hole transport layer 13 may be substantially equal to the HOMO energy level of the hole transport material.

For example, a difference between the HOMO energy level ($HOMO_{HTL}$) of the hole transport material of the hole transport layer 13 and the HOMO energy level ($HOMO_{QD}$) of the quantum dots of the quantum dot layer 14 may be about 0.7 eV or less, for example, about 0 eV to about 0.7 eV, for example about 0 eV to about 0.6 eV, for example about 0 eV to about 0.5 eV, about 0.01 eV to about 0.7 eV, about 0.01 eV to about 0.6 eV, about 0.01 eV to about 0.5 eV, about 0.01 eV to about 0.4 eV, about 0.01 eV to about 0.3 eV, about 0.01 eV to about 0.2 eV, or about 0.01 eV to about 0.1 eV.

For example, the HOMO energy level ($HOMO_{HTL}$) of the hole transport material of the hole transport layer 13 may be equal to or less than the HOMO energy level ($HOMO_{QD}$) of the quantum dots of the quantum dot layer 14, for example, within about 0.7 eV or less.

The HOMO energy level ($HOMO_{HTL}$) of the hole transport material of the hole transport layer 13 may be, for example, about 5.4 eV or greater, about 5.6 eV or greater, or about 5.8 eV or greater. For example, the HOMO energy level ($HOMO_{HTL}$) of the hole transport material of the hole transport layer 13 may be about 5.4 eV to about 7.0 eV, about 5.4 eV to about 6.8 eV, about 5.4 eV to about 6.7 eV, about 5.4 eV to about 6.5 eV, about 5.4 eV to about 6.3 eV, about 5.4 eV to about 6.2 eV, about 5.4 eV to about 6.1 eV, about 5.6 eV to about 7.0 eV, about 5.6 eV to about 6.8 eV, about 5.6 eV to about 6.7 eV, about 5.6 eV to about 6.5 eV, about 5.6 eV to about 6.3 eV, about 5.6 eV to about 6.2 eV, about 5.6 eV to about 6.1 eV, about 5.8 eV to about 7.0 eV, about 5.8 eV to about 6.8 eV, about 5.8 eV to about 6.7 eV, about 5.8 eV to about 6.5 eV, about 5.8 eV to about 6.3 eV, about 5.8 eV to about 6.2 eV, or about 5.8 eV to about 6.1 eV.

For example, the hole transport material of the hole transport layer 13 may include a first hole transport material and a second hole transport material, wherein the first and second hole transport materials have different HOMO energy levels. At least one of the first hole transport material and the second hole transport material may be selected from materials satisfying the HOMO energy level, and for example the second hole transport material may have a higher HOMO energy level than the first hole transport material. For example, a HOMO energy level of the first hole transport material may be less than about 5.4 eV and a HOMO energy level of the second hole transport material may be about 5.4 eV or greater. For example, the HOMO energy level of the first hole transport material may be from about 4.5 eV or greater to about 5.4 eV or less, and the HOMO energy level of the second hole transport material may be about 5.4 eV to about 7.0 eV. The HOMO energy level of the second hole transport material may be, for example, about 5.4 eV to about 6.8 eV, about 5.4 eV to about 6.7 eV, about 5.4 eV to about 6.5 eV, about 5.4 eV to about 6.3 eV, about 5.4 eV to about 6.2 eV, about 5.4 eV to about 6.1 eV, about 5.6 eV to about 7.0 eV, about 5.6 eV to about 6.8 eV, about 5.6 eV to about 6.7 eV, about 5.6 eV to about 6.5 eV, about 5.6 eV to about 6.3 eV, about 5.6 eV to about 6.2 eV, about 5.6 eV to about 6.1 eV, about 5.8 eV to about 7.0 eV, about 5.8 eV to about 6.8 eV, about 5.8 eV to about 6.7 eV, about 5.8 eV to about 6.5 eV, about 5.8 eV to about 6.3 eV, about 5.8 eV to about 6.2 eV, or about 5.8 eV to about 6.1 eV.

The hole transport material of the hole transport layer 13 may not be particularly limited as long as a material satisfies the energy level and/or hole mobility properties of the hole transport layer. The hole transport material may include, for example, a polymer compound that is poly(9,9-dioctyl-fluorene-co-N-(4-butylphenyl)-diphenylamine) (TFB), polyarylamine, poly(N-vinylcarbazole), polyaniline, polypyrrole, or a copolymer thereof, N,N,N',N'-tetrakis(4-methoxyphenyl)-benzidine (TPD), 4,4'-bis[N-(1-naphthyl)-N-phenyl-amino]biphenyl (α-NPD), 4,4',4"-tris[phenyl(m-tolyl)amino]triphenylamine (m-MTDATA), 4,4',4"-tris(N-carbazolyl)-triphenylamine (TCTA), 1,1-bis[(di-4-tolylamino)phenylcyclohexane (TAPC), a p-type metal oxide (e.g., NiO, $WO_3$, or $MoO_3$), fluorene or a derivative thereof, a carbonaceous material such as graphene oxide, or a combination thereof but is not limited thereto.

The hole transport layer 13 may further include an electron transport material. Herein, the electron transport material may be a material having conduction characteristics along the LUMO energy level when an electric field is applied. The electron transporting material of the hole transporting layer 13 may effectively transport electrons passing through the quantum dot layer 14 and/or electrons accumulated at the interface between the hole transporting layer 13 and the quantum dot layer 14.

Generally, in a quantum dot device, mobility of holes and electrons may be different, and for example, the mobility of electrons may be higher than the mobility of holes. Accordingly, mobility imbalances between the holes moving from the anode 11 to the quantum dot layer 14 and the electrons moving from the cathode 16 to the quantum dot layer 14 may be caused. Thus, relatively faster electrons may not be coupled with the holes inside the quantum dot layer 14 and may be accumulated at the interface between the quantum dot layer 14 and the hole transport layer 13. The electrons accumulated at the interface between the quantum dot layer 14 and the hole transport layer 13 may deteriorate a quantum dot device to shorten a life-span of the quantum dot device.

In an embodiment, electrons passing through the quantum dot layer 14 may be injected into the hole injection layer 12 along the LUMO energy level of the hole transport layer 13 by including the electron transport material in the hole transport layer 13, and thus electrons may be prevented from accumulating at the interface between the quantum dot layer 14 and the hole transport layer 13. As a result, deterioration of the quantum dot device may be prevented and life-span characteristics can be improved.

The electron transporting material of the hole transporting layer 13 may be selected from materials having a LUMO energy level ($LUMO_{HTL2}$) equal to or similar to the LUMO energy level ($LUMO_{QD}$) of the quantum dot layer 14, and for example a difference between the LUMO energy levels of the electron transport material of hole transport layer 13 and the quantum dot layer 14 may be about 0.5 eV or less. Within the range, the difference between the LUMO energy levels of the electron transport material of the hole transport layer 13 and the quantum dot layer 14 may be, for example, about 0 eV to about 0.5 eV, about 0.01 eV to about 0.4 eV, about 0.01 eV to about 0.38 eV, about 0.01 eV to about 0.35 eV, or about 0.01 eV to about 0.30 eV.

For example, a LUMO energy level ($LUMO_{HTL2}$) of the electron transport material of the hole transport layer 13 may be about 2.7 eV to about 3.5 eV, about 2.7 eV to about 3.4 eV, about 2.8 eV to about 3.3 eV, about 2.9 eV to about 3.2 eV, or about 2.9 eV to about 3.1 eV.

The electron transport material of the hole transport layer 13 may be an organic material, an inorganic material, an organic/inorganic material, or a combination thereof, and may be, for example a low molecular weight compound, for example 1,4,5,8-naphthalene-tetracarboxylic dianhydride (NTCDA), bathocuproine (BCP), tris[3-(3-pyridyl)-mesityl]borane (3TPYMB), LiF, Alq3, Gaq3, Inq3, Znq2, Zn(BTZ)2, BeBq2, ET204 (8-(4-(4,6-di(naphthalen-2-yl)-1,3,5-triazin-2-yl)phenyl)quinolone), 8-hydroxyquinolinato lithium (Liq), n-type metal oxide (e.g., ZnO, $HfO_2$, etc.), a compound including a phosphine oxide moiety, a compound including a pyrazole moiety, or a combination thereof, but is not limited thereto. As used herein, the term "low molecular weight compound" refers to a compound having a molecular weight of 10,000 grams per mole (g/mol) or less, for example 5,000 g/mol or less, or 1,000 g/mol or less, or 500 g/mol or less.

The hole transport layer 13 may include the hole transport material and the electron transport material and may include, for example, a mixture of a hole transport material and an electron transport material. In this case, the electron transport material may be included in the same amount as the hole transport material, or in an amount that is less than the amount of the hole transport material. For example, the hole transport material and the electron transport material may be included in the hole transport in a weight ratio of about 5:5 to about 9:1.

The electron auxiliary layer 15 may be disposed between the cathode 16 and the quantum dot layer 14 and may include one layer or two or more layers. The electron auxiliary layer 15 may be an electron transport layer, an electron injection layer, a hole blocking layer, or a combination thereof, and may be omitted as needed.

The electron transport layer may include, for example, 1,4,5,8-naphthalene-tetracarboxylic dianhydride (NTCDA), bathocuproine (BCP), tris[3-(3-pyridyl)-mesityl]borane (3TPYMB), LiF, Alq3, Gaq3, Inq3, Znq2, Zn(BTZ)2, BeBq2, ET204 (8-(4-(4,6-di(naphthalen-2-yl)-1,3,5-triazin-2-yl)phenyl)quinolone), 8-hydroxyquinolinato lithium (Liq), n-type metal oxide (e.g., ZnO, $HfO_2$ etc.), a compound including a pyrazole moiety, a phosphine oxide compound, or a combination thereof, but is not limited thereto.

The hole blocking layer may include, for example, 1,4,5,8-naphthalene-tetracarboxylic dianhydride (NTCDA), bathocuproine (BCP), tris[3-(3-pyridyl)-mesityl]borane (3TPYMB), LiF, Alq3, Gaq3, Inq3, Znq2, Zn(BTZ)2, BeBq2, or a combination thereof, but is not limited thereto.

The hole injection layer 12, the hole transport layer 13, the quantum dot layer 14, and the electron auxiliary layer 15 may be, for example, formed with a solution process or deposition process. The solution process may be, for example, spin coating, slit coating, inkjet printing, a nozzle printing, spraying, doctor blade coating, or a combination thereof, but is not limited thereto.

The quantum dot device may be, for example, applied to various electronic devices such as display devices or lighting devices, or the like.

Hereinafter, one or more of the exemplary embodiments are illustrated in further detail with reference to examples. However, these examples are exemplary, and the present scope is not limited thereto.

EXAMPLES

Synthesis of Quantum Dot

Synthesis Example 1: Synthesis of ZnTeSe Core

Selenium (Se) and tellurium (Te) are each individually dispersed in trioctylphosphine (TOP) to obtain a 2 moles per liter (M) Se/TOP stock solution and a 0.1 M Te/TOP stock solution. 0.125 millimoles (mmol) of zinc acetate, 0.25 mmol of palmitic acid, and 0.25 mmol of hexadecylamine are put along with 10 milliliters (mL) of trioctylamine in a reactor and then, heated at 120° C. under vacuum. After 1 hour, an atmosphere in the reactor is converted into nitrogen. After heating the reactor at 300° C., the Se/TOP stock solution and the Te/TOP stock solution are rapidly added thereto in a Te/Se molar ratio of 1:25. After 30 minutes, the reaction solution is rapidly cooled to room temperature (ca. 23° C.), acetone is added thereto, and a precipitate obtained by centrifuging the mixture is dispersed in toluene to obtain a ZnTeSe quantum dot.

Synthesis Example 2: Synthesis of ZnTeSe Core/ZnSeS Shell Quantum Dot 1.8 mmol (0.336 g) of zinc acetate, 3.6 mmol (1.134 g) of oleic acid, and 10 mL of trioctylamine are put into a flask and a vacuum is applied at 120° C. for 10 minutes. The inside of flask is re-filled with nitrogen ($N_2$) and heated at 180° C. The ZnTeSe core obtained in Synthesis Example 1 is put therein within 10 seconds, subsequently, 0.04 mmol of Se/TOP is slowly injected, and the resulting mixture is then heated at 280° C. Then, 0.01 mmol of STOP is added thereto and heated at 320° C. for 10 minutes. Subsequently, a mixed solution of 0.02 mmol of Se/TOP and 0.04 mmol of S/TOP is slowly injected thereto and reacted for an additional 20 minutes. Then, the step of injecting Se and S by changing the mixing ratio thereof and reacting the same for 20 minutes is repeated. The mixed solution of Se and S uses a mixed solution of 0.01 mmol Se/TOP+0.05 mmol S/TOP, a mixed solution of 0.005 mmol Se/TOP+0.1 mmol S/TOP, and a solution of 0.5 mmol S/TOP, sequentially. After completing the reaction, the reactor is cooled, the prepared nanocrystal is precipitated with ethanol, and the obtained nanocrystal is centrifuged with ethanol and dispersed in toluene to obtain a dispersion of ZnTeSe/ZnSeS core/shell quantum dots.

Manufacture of Quantum Dot Device

Example 1

A glass substrate deposited with ITO electrode material (WF: 4.8 eV) having a thickness of 150 nm is surface-treated with a UV-ozone treatment for 15 minutes, spin-coated with a PEDOT:PSS solution (H.C. Starks Co., Ltd.), and heat-treated under the air atmosphere at 150° C. for 10 minutes and then, under an $N_2$ atmosphere at 150° C. for 10 minutes to form a hole injection layer (HOMO energy level: 5.3 eV and LUMO energy level: 2.7 eV) having a thickness of 25 nm. Subsequently, on the hole injection layer, a hole transport layer having a thickness of 25 nm is formed by spin-coating a mixture including a polymer compound (hole transport material) (HOMO energy level: 5.4 eV, LUMO energy level: 2.4 eV) including a dioctyl fluorene moiety and a triphenylamine moiety, and a phosphine oxide compound (electron transport material, ABH113, Sun Chem) (HOMO energy level: 6.0 eV, LUMO energy level: 3.0 eV) in a ratio of 1:1 (wt/wt) and heat-treating the same at 150° C. for 30 minutes. Then, on the hole transport layer, a quantum dot layer (HOMO energy level: 6.0 eV, LUMO energy level: 3.3 eV, peak emission wavelength: 453 nm) having a thickness of 20 nm was formed by spin-coating the dispersion of ZnTeSe/ZnSeS core/shell quantum dots obtained in Synthesis Example 2 and heat-treating the same at 150° C. for 30 minutes. Then, on the quantum dot layer, an electron auxiliary layer having a thickness of 36 nm is formed by vacuum-depositing a dopant including a pyrazole moiety and a phosphine oxide compound (1:3, wt/wt) and thereon a cathode is formed by vacuum-depositing Liq to a thickness of 5 nm and aluminum (Al) to a thickness of 90 nm to manufacture a quantum dot device.

Comparative Example 1

A quantum dot device is manufactured according to the same method as Example 1, except only the hole transport material is included in the hole transport layer instead of the mixture of the hole transport material and the electron transport material.

Example 2

A glass substrate deposited with ITO electrode material (WF: 4.8 eV) having a thickness of 150 nm is surface-treated with a UV-ozone treatment for 15 minutes, spin-coated with a PEDOT:PSS solution (H.C. Starks Co., Ltd.), and heat-treated under the air atmosphere at 150° C. for 10 minutes and then, under an $N_2$ atmosphere at 150° C. for 10 minutes to form a 25 hole injection layer (HOMO energy level: 5.3 eV and LUMO energy level: 2.7 eV) having a thickness of 25 nm. Subsequently, on the hole injection layer, a hole transport layer having a thickness of 25 nm is formed by spin-coating a mixture including poly[(9,9-d ioctylfluorenyl-2,7-diyl-co(4,4'-(N-4-butylphenyl)diphenylamine] solution (TFB) (hole transport material) (HOMO energy level: 5.6 eV, LUMO energy level: 2.7 eV), and a phosphine oxide compound (electron transport material, ABH113, Sun Chem) (HOMO energy level: 6.0 eV, LUMO energy level: 3.0 eV) in a ratio of 1:1(wt/wt) and heat-treating the same at 150° C. for 30 minutes. Then, on the hole transport layer, a quantum dot layer (HOMO energy level: 6.0 eV, LUMO energy level: 3.3 eV, peak emission wavelength: 453 nm) having a thickness of 25 nm is formed by spin-coating the dispersion of ZnTeSe/ZnSeS core/shell quantum dots obtained in Synthesis Example 2, and heat-treating the same at 150° C. for 30 minutes. Then, on the quantum dot layer, an electron auxiliary layer having a thickness of 36 nm is formed by vacuum-depositing a dopant including a pyrazole moiety and a phosphine oxide compound in a ratio of 1:3 (wt/wt) and thereon a cathode is formed by vacuum-depositing Liq to a thickness of 5 nm and aluminum (Al) to a thickness of 90 nm to manufacture a quantum dot device.

Comparative Example 2

A quantum dot device is manufactured according to the same method as Example 2, except only the hole transport material is included in the hole transport layer instead of the mixture of the hole transport material and the electron transport material.

Evaluation

Current-voltage-luminescence (C-V-L) characteristics of the quantum dot devices according to Examples 1 and 2 and Comparative Examples 1 and 2 are evaluated.

The current-voltage-luminescence characteristics are evaluated by using a Keithley 220 current source and a Minolta CS200 spectroradiometer.

The results are shown in Tables 1 and 2.

TABLE 1

|  | Example 1 | Comparative Example 1 |
|---|---|---|
| Cd/m$^2$ @ 5 mA | 566.075 | 7.556 |
| $\lambda_{max}$ | 455 | 456 |
| Full width at half maximum (FWHM) (nm) | 30 | 31 |
| T95 (h) | 0.25 | 0.10 |
| T50 (h) | 1.32 | 0.70 |

TABLE 2

|  | Example 2 | Comparative Example 2 |
|---|---|---|
| EQE$_{max}$ | 6.476 | 4.393 |
| EQE at 100 cd/m$^2$ | 6.475 | 4.279 |
| EQE at 500 cd/m$^2$ | 5.936 | 4.170 |
| EQE at 1000 cd/m$^2$ | 5.157 | 3.694 |
| Cd/A$_{max}$ | 4.322 | 2.880 |
| Luminance at 5 mA | 206.404 | 143.975 |
| $\lambda_{max}$ (nm) | 455 | 455 |
| Full width at half maximum (FWHM) (nm) | 25 | 25 |
| Lum$_{max}$ | 4428 | 3350 |
| T50 (h) | 0.75 | 0.48 |

EQE$_{max}$: maximum external quantum efficiency
EQE at 100 cd/m$^2$, 500 cd/m$^2$, 1000 cd/m$^2$: external quantum efficiency at 100 cd/m$^2$, 500 cd/m$^2$, or 1000 cd/m$^2$
Cd/A max: maximum current efficiency (candela per ampere, cd/A)
Luminance at 5 mA: luminance (candela per square meter, cd/m$^2$) at 5 milliamperes (mA)
$\lambda_{max}$: maximum light emitting wavelength (nanometers, nm)
Lum$_{max}$: maximum luminance
T95 (h): a time (hours, h) required to obtain the luminance of 95% from the initial luminance of 100%
T50 (h): a time (hours, h) required to obtain the luminance of 50% from the initial luminance of 100%

Referring to Tables 1 and 2, the quantum dot devices according to Examples 1 and 2 show improved current characteristics and life-span compared with the quantum dot device according to Comparative Examples 1 and 2.

While this disclosure has been described in connection with one or more exemplary embodiments, it is to be understood that the bounds of this disclosure are not limited to the disclosed embodiments. On the contrary, it is intended to cover various modifications and equivalent arrangements included within the spirit and scope of the appended claims.

What is claimed is:
1. A quantum dot device, comprising
an anode;
a cathode disposed substantially opposite to the anode;
a hole injection layer disposed on the anode between the anode and the cathode;
a hole transport layer disposed on the hole injection layer between the hole injection layer and the cathode; and
a quantum dot layer disposed on the hole transport layer between the hole transport layer and the cathode,
wherein the quantum dot layer comprises a plurality of quantum dots,
wherein the hole transport layer comprises a hole transport material and an electron transport material, and
wherein a difference between a lowest unoccupied molecular orbital (LUMO) energy level of the electron transport material and a lowest unoccupied molecular orbital (LUMO) energy level of the quantum dot layer is about 0.5 electron volts or less.
2. The quantum dot device of claim 1, wherein a lowest unoccupied molecular orbital (LUMO) energy level of the electron transport material is about 2.7 electron volts to about 3.5 electron volts.
3. The quantum dot device of claim 1, wherein a highest occupied molecular orbital (HOMO) energy level of the hole transport material is about 5.4 electron volts or greater.

4. The quantum dot device of claim 3, wherein a highest occupied molecular orbital (HOMO) energy level of the hole transport material is about 5.4 electron volts to about 7.0 electron volts.

5. The quantum dot device of claim 1, wherein the hole transport material comprises a polymer compound, and the electron transport material comprises a low molecular weight compound.

6. The quantum dot device of claim 1, wherein the hole transport material comprises a first hole transport material and a second hole transport material, and
a highest occupied molecular orbital (HOMO) energy level of the second hole transport material is greater than a highest occupied molecular orbital (HOMO) energy level of the first hole transport material.

7. The quantum dot device of claim 6, wherein the highest occupied molecular orbital HOMO energy level of the second hole transport material is about 5.4 electron volts to about 7.0 electron volts.

8. The quantum dot device of claim 1, wherein the hole transport material and the electron transport material are intermixed in the hole transport layer.

9. The quantum dot device of claim 8, wherein the hole transport layer comprises the electron transport material in an amount that is equal to or less than an amount of the hole transporting material.

10. The quantum dot device of claim 1, wherein a difference between a highest occupied molecular orbital (HOMO) energy level of the quantum dot layer and a highest occupied molecular orbital (HOMO) energy level of the hole transport material is about 0.7 electron volts or less.

11. The quantum dot device of claim 1, wherein a highest occupied molecular orbital (HOMO) energy level of the quantum dot layer is about 5.6 electron volts or greater.

12. The quantum dot device of claim 1, wherein the hole transport layer and the quantum dot layer are in direct contact with each other.

13. The quantum dot device of claim 1, wherein the hole injection layer comprises a conductive polymer.

14. The quantum dot device of claim 1, wherein the plurality of quantum dots comprises a non-cadmium quantum dot.

15. The quantum dot device of claim 1, wherein the plurality of quantum dots comprises:
a core comprising a first semiconductor compound comprising zinc, tellurium, and selenium; and
a shell disposed on at least a portion of the core and comprising a second semiconductor compound different from the first semiconductor compound.

16. The quantum dot device of claim 15, wherein the second semiconductor compound is ZnSeS, ZnS, or a combination thereof.

17. An electronic device comprising the quantum dot device of claim 1.

18. A method of producing the quantum dot device of claim 1, the method comprising:
providing the anode;
disposing the hole injection layer on the anode;
disposing the hole transport layer on the hole injection layer on a side opposite the anode;
disposing the quantum dot layer on the hole transport layer on a side opposite the hole injection layer; and
disposing the cathode on the quantum dot layer on a side opposite the hole transport layer.

19. The method of claim 18, further comprising disposing an electron auxiliary layer between the quantum dot layer and the cathode layer.

20. The method of claim 19, wherein the electron auxiliary layer is an electron transport layer, an electron injection layer, a hole blocking layer, or a combination thereof.

\* \* \* \* \*